(12) United States Patent
Moitzi

(10) Patent No.: US 11,551,989 B2
(45) Date of Patent: Jan. 10, 2023

(54) COMPONENT CARRIER AND METHOD OF MANUFACTURING THE SAME

(71) Applicant: AT&S Austria Technologie & Systemtechnik Aktiengesellschaft, Leoben (AT)

(72) Inventor: Heinz Moitzi, Zeltweg (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/949,407

(22) Filed: Oct. 28, 2020

(65) Prior Publication Data

US 2021/0193541 A1 Jun. 24, 2021

(30) Foreign Application Priority Data

Dec. 20, 2019 (EP) ..................................... 19218396

(51) Int. Cl.
*H05K 1/18* (2006.01)
*H01L 23/31* (2006.01)
*H01L 21/56* (2006.01)
*H01L 23/485* (2006.01)
*H01L 23/29* (2006.01)
*H05K 1/03* (2006.01)

(52) U.S. Cl.
CPC .......... *H01L 23/3121* (2013.01); *H01L 21/56* (2013.01); *H01L 23/485* (2013.01); *H05K 1/186* (2013.01); *H01L 23/295* (2013.01); *H05K 1/0373* (2013.01); *H05K 2201/0209* (2013.01)

(58) Field of Classification Search
CPC . H01L 23/3132; H01L 23/485; H01L 23/295; H01L 21/56; H05K 1/186; H05K 1/0373; H05K 1/185
See application file for complete search history.

(56) References Cited

U.S. PATENT DOCUMENTS

2002/0094929 A1* 7/2002 Kawai ................... C03C 14/004
501/32
2004/0099364 A1* 5/2004 Suzuki .................. C04B 35/111
156/89.11

(Continued)

FOREIGN PATENT DOCUMENTS

CN 209471956 U 10/2019
EP 3 340 752 A1 6/2018

(Continued)

OTHER PUBLICATIONS

Tomezak, Alexandre; EESR in Application No. 19218396.0; pp. 1-8; dated Jun. 24, 2020; European Patent Office, 80298, Munich Germany.

*Primary Examiner* — Hoa C Nguyen
(74) *Attorney, Agent, or Firm* — Robert A. Blaha; Smith Tempel Blaha LLC

(57) ABSTRACT

A component carrier includes a stack having at least one electrically conductive layer structure and at least one electrically insulating layer structure; a barrier structure; and a component. The component has at least one pad embedded in the stack and/or in the barrier structure. At least a portion of one of the electrically conductive layer structure and the at least one pad includes copper in contact with the barrier structure.

13 Claims, 6 Drawing Sheets

(56) References Cited

U.S. PATENT DOCUMENTS

| | | | |
|---|---|---|---|
| 2013/0201631 A1* | 8/2013 | Parker | H05K 13/0465 |
| | | | 361/728 |
| 2014/0151856 A1 | 6/2014 | Otremba et al. | |
| 2014/0247561 A1* | 9/2014 | Inui | H05K 1/0206 |
| | | | 361/707 |
| 2017/0033009 A1* | 2/2017 | Scanlan | H01L 21/561 |
| 2017/0171978 A1 | 6/2017 | Yang et al. | |
| 2018/0007792 A1* | 1/2018 | Kawai | H05K 3/4697 |
| 2019/0043794 A1* | 2/2019 | Kapusta | H01L 23/49811 |
| 2019/0223298 A1* | 7/2019 | Silvano De Sousa | |
| | | | H05K 3/4688 |

FOREIGN PATENT DOCUMENTS

| | | |
|---|---|---|
| EP | 3 364 456 A2 | 8/2018 |
| WO | 2014051233 A2 | 4/2014 |

* cited by examiner

COMPONENT CARRIER AND METHOD OF MANUFACTURING THE SAME

TECHNICAL FIELD

The invention relates to a component carrier and to a method of manufacturing the same.

TECHNOLOGICAL BACKGROUND

A conventional component carrier such as a printed circuit board comprises a stack having at least one electrically conductive layer structure and at least one electrically insulating layer structure, and a component having at least one pad and being embedded in the stack. High performance and low energy consumption combined with compact dimensions and the lowest possible weight are usually target requirements for modern electronic assemblies. By embedding chips in the printed circuit board, excellent developments have been made in the recent years, particularly in the automotive sector.

However, it has been revealed that a combination of strong electric fields and high temperatures (higher than 120° C. or even higher than 155° C.) especially occur in embedded power components and promote a migration of electrically conductive material. Such a migration is a transport of metallic material caused by the gradual movement of ions in a conductor due to a momentum transfer between conducting electrons and diffusing metal atoms. Such a migration usually occurs in the form of dendrites at transition areas of component pads and copper contacts and may lead to short circuits and other failures in the assembly. Such a migration particularly occurs in applications with high direct current densities, such as in automotive applications, microelectronics and related structures. As the structure size in assemblies is miniaturized, the practical significance of this effect increases. In some cases, electrochemical migration is caused by chlorides in a base material such as FR4, but also by residues of chlorides in an etching solution.

SUMMARY

There may be a need for a component carrier and a method of manufacturing the same, by which failures caused by a migration of electrically conductive material can be reduced.

According to an exemplary embodiment of the invention, a component carrier comprises a stack comprising at least one electrically conductive layer structure and at least one electrically insulating layer structure, a barrier structure, a component having at least one pad and being embedded in the stack and/or in the barrier structure. At least a portion of at least one of the at least one electrically conductive layer structure and the at least one pad comprises copper in contact with the barrier structure.

According to another exemplary embodiment of the invention, a method of manufacturing a component carrier comprises: forming a stack comprising at least one electrically conductive layer structure and at least one electrically insulating layer structure, forming a barrier structure connected with the stack, embedding a component having at least one pad in the stack and/or in the barrier structure, and arranging at least a part of copper material of at least one of the at least one electrically conductive layer structure and/or of the at least one pad in contact with the barrier structure.

According to another exemplary embodiment of the invention, a method of using a mold material of the above-mentioned component carrier reduces or inhibits copper migration when conducting an electric current, in particular a current of at least 1 Ampere, by at least one of the at least electrically conductive layer structure and/or by the at least one pad. In particular, the barrier structure can substantially inhibit the copper migration with the current having a current density up to 100 kA/cm$^2$, preferably up to 200 kA/cm$^2$ and most preferred up to a value being higher than 200 kA/cm$^2$.

According to another embodiment, a method includes providing a component carrier including a stack, a barrier structure connected to the stack and a component having at least one pad, the component being embedded in the stack and/or in the barrier structure, the stack having at least one electrically conductive layer structure and at least one electrically insulating layer structure, wherein at least a portion of one of the at least one electrically conductive layer structure and the at least one pad comprises copper in contact with the barrier structure; applying a mold material to the component carrier; and applying an electrical potential to the component carrier thereby reducing or inhibiting copper migration when conducting an electric current, in particular a current of at least 1 Ampere, by at least one of the at least electrically conductive layer structure and/or by the at least one pad.

By the barrier structure, which can be for example a chloride-impermeable layer which is partially or completely connected to an adjacent layer, the migration of electrically conductive material, in particular of copper, is prevented or considerably reduced. According to the invention, the barrier structure can be applied as an insulating layer as close as possible to pads, terminals or connections of the component. Ideally, the entire component can be covered by the barrier structure. The barrier structure can also act as a shielding against EMI or other influencing interferences such as magnetism, radio frequencies, etc. and may additionally protect the component for example from external influences such as mechanical stress, humidity, heat, etc.

It was also found that substantially complete wetting of fillers by the surrounding barrier structure, which is for example a molded structure having a resin basis, can have a significant contribution to a reduction/prevention of copper migration.

Preferably, the barrier structure comprises an electrically non-conductive material, in particular a ceramic material. Non-limiting examples are SiC, SiN and SiO$_2$. Such material should exhibit a good adhesion between a resin matrix and fillers because the fewer or smaller the clearances are, the smaller the risk of copper migration is. Compared with FR-4, materials with lower chlorine content, higher glass transition temperature (Tg) and lower percentage of relative humidity (rH) are beneficial. Preferably, the barrier structure is a molded structure, i.e. the barrier structure comprises a molding material. The molding material can contain the ceramic material. The higher the ceramic content is, the more effective the migration of electrically conductive material is prevented from occurring. For example, epoxy resins filled with SiO$_2$ with a concentration of fillers up to 90 percent by weight can be used. With these materials, expansion coefficients being smaller than 10 ppm/K and glass transition temperatures being larger than 200° C. can be realized, which are thus well adapted to common substrate materials and components.

Depending on the material, the barrier structure, which is for example in the shape of a layer, has also a higher stiffness compared to standard insulating materials such as FR4 or ABF, which means that the barrier structure layers can be very thin and still remain warp-resistant. This is an excellent advantage in a realization of (thin) layers with embedded components in a coreless process.

Besides the ceramic material, the barrier structure can comprise a hydrophobic material and/or a diffusion barrier material, for example tantalum (Ta).

Overview of Embodiments

In the context of the present application, the term "partially protrude" can mean that a part of the component is embedded in the base structure and the remaining part of the component protrudes from the base structure.

In the context of the present application, the term "main surface" can refer to a surface of the component where electric terminals are arranged. The term "main surface" can also refer to a surface of component which is perpendicular to a direction in which layers of the stack are arranged or layered one upon the other.

In the context of the present application, the term "top main surface" can refer to a main surface of the component where a source terminal of the component is arranged. The term "top main surface" can also refer to that main surface of the component which is opposite to a main surface of the component which is embedded in or connected to the base structure. The term "top main surface" can also refer to that main surface of the component which is first inserted into a cavity of the component carrier during a manufacturing process.

The component carrier with the above-mentioned configuration exhibits improved heat spreading from the component, in particular by the heat removing and electrically conductive base structure. High currents flowing vertically through the component carrier can be realized, and an effective thermal management by heat spreading can be achieved. The component carrier of the present invention can be used in applications of about 50 kW, for example in the field of automotive semiconductor applications.

The top structure improves the rigidity of the component carrier.

In the following, further exemplary embodiments of the present invention will be explained.

In an embodiment, the barrier structure is a molded structure which preferably comprises the ceramic material. The barrier structure having ceramic material can readily be applied.

In an embodiment, the embedded component is a semiconductor chip, in particular a power semiconductor chip. A power semiconductor chip is usually susceptible to migration of electrically conductive material which can be reduced or avoided by the barrier structure.

In an embodiment, the barrier structure directly contacts, in particular directly surrounds, at least a part of one of the at least one electrically conductive layer structure and/or the at least one pad. In an embodiment, the component is partially or entirely embedded within the barrier structure. The electrically conductive layer structure, the pad and/or the component are thus well protected against the migration of electrically conductive material.

In an embodiment, the at least one electrically conductive layer structure comprises at least one of the group consisting of a vertical through-connection, in particular a copper via, and a patterned electrically conductive layer, in particular a patterned copper foil. Thereby, signals from the component can be passed through the barrier structure.

In an embodiment, the barrier structure is vertically sandwiched between a first portion of the stack and a second portion of the stack.

In an embodiment, the component is accommodated in a cavity of the stack, and the barrier structure closes the cavity. Thereby, the barrier structure has a double function of preventing the migration of electrically conductive material and also of closing the cavity.

In an embodiment, the component is laterally surrounded by the stack and mounted on the barrier structure.

In an embodiment, apart from its main surface with the at least one pad, the component is surrounded by material of the stack, and the main surface of the component with the at least one pad and also the at least one electrically conductive layer structure connected thereto are connected to the barrier structure.

In an embodiment, the component carrier comprises at least one of the following features: the component carrier comprises at least one component being surface mounted on and/or embedded in the component carrier, wherein the at least one component is in particular selected from a group consisting of an electronic component, an electrically non-conductive and/or electrically conductive inlay, a heat transfer unit, a light guiding element, an optical element, a bridge, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip; wherein at least one of the electrically conductive layer structures of the component carrier comprises at least one of the group consisting of copper, aluminum, nickel, silver, gold, palladium, and tungsten, any of the mentioned materials being optionally coated with supra-conductive material such as graphene; wherein the electrically insulating layer structure comprises at least one of the group consisting of resin, in particular reinforced or non-reinforced resin, for instance epoxy resin or bismaleimide-triazine resin, FR-4, FR-5, cyanate ester, polyphenylene derivate, glass, prepreg material, polyimide, polyamide, liquid crystal polymer, epoxy-based build-up film, polytetrafluoroethylene, a ceramic, and a metal oxide; wherein the component carrier is shaped as a plate; wherein the component carrier is configured as one of the group consisting of a printed circuit board, a substrate, and an interposer; wherein the component carrier is configured as a laminate-type component carrier.

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Size Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imagable or dry-etchable organic material like epoxy-based build-up material (such as epoxy-based build-up film) or polymer compounds like polyimide, polybenzoxazole, or benzocyclobutene.

In an embodiment, the at least one electrically insulating layer structure comprises at least one of the group consisting of resin (such as reinforced or non-reinforced resins, for instance epoxy resin or bismaleimide-triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (Teflon®), a ceramic, and a metal oxide. Teflon® is a registered mark of The Chemours Company FC LLC of Wilmington, Del., U.S.A. Reinforcing materials such as webs, fibers or spheres, for example made of glass (multilayer glass) may be used as well. Although prepreg particularly FR4 are usually preferred for rigid PCBs, other materials in particular epoxy-based build-up film or photo-imagable dielectric material may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an optical element (for instance a lens), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, etc.

The aspects defined above and further aspects of the invention are apparent from the examples of embodiment to be described hereinafter and are explained with reference to these illustrated examples.

DETAILED DESCRIPTION OF THE ILLUSTRATED EMBODIMENTS

Figure 1:
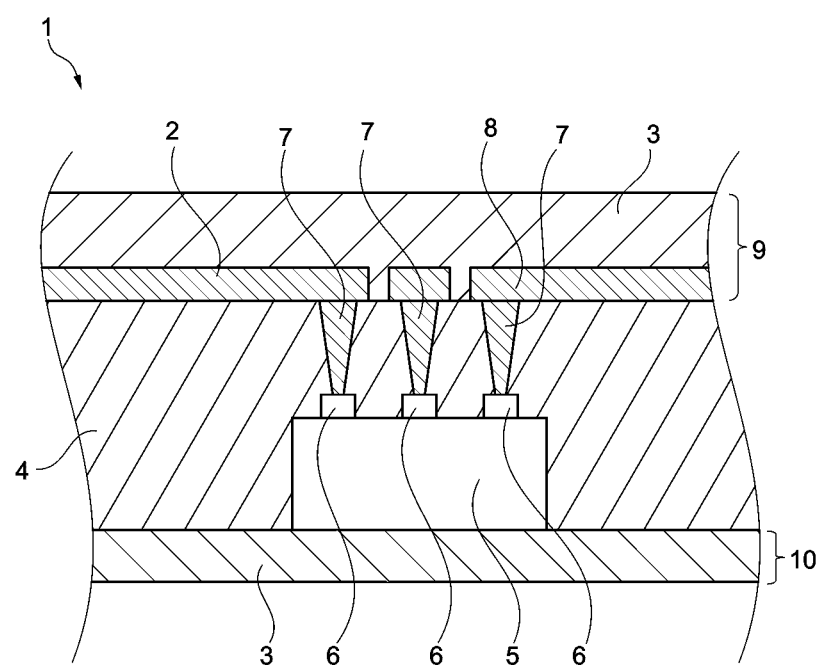
FIG. 1 illustrates a cross-sectional view of a component carrier according to an exemplary embodiment of the invention.

The illustrations in the drawings are schematically presented. In different drawings, similar or identical elements are provided with the same reference signs.

FIG. 1 illustrates a cross-sectional view of a component carrier 1 according to an exemplary embodiment of the invention. The component carrier 1 is shaped as a plate. The component carrier 1 can be configured as one of the group consisting of a printed circuit board, a substrate, and an interposer. The component carrier 1 can be configured as a laminate-type component carrier.

The component carrier 1 comprises a stack having an electrically conductive layer structure 2 and an electrically insulating layer structure 3.

The electrically conductive layer structure 2 of the component carrier comprises at least one of the group consisting of copper, aluminum, nickel, silver, gold, palladium, and tungsten, any of the mentioned materials being optionally coated with supra-conductive material such as graphene.

The electrically conductive layer structure 2 comprises vertical through-connections 7, in particular a copper vias, and a patterned electrically conductive layer 8, in particular a patterned copper foil.

The electrically insulating layer structure 3 comprises at least one of the group consisting of resin, in particular reinforced or non-reinforced resin, for instance epoxy resin or Bismaleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide.

The component carrier 1 comprises a barrier structure 4 and a component 5 having pads 6 and being embedded in the stack and in the barrier structure 4. In the embodiment of FIG. 1, the barrier structure 4 is a molded structure and a material of the barrier structure 4 comprises a ceramic material, such as $SiO_2$.

The barrier structure 4 is used for inhibiting copper migration when conducting an electric current, in particular a current of at least 1 Ampere, by at least one of the electrically conductive layer structure 2 and/or by the pads 6. By the barrier structure 4, which can be for example a chloride-impermeable layer which is partially or completely applied on the lower electrically insulating layer structure 3, the migration of electrically conductive material, in particular of copper, is prevented or considerably reduced. The barrier structure 4 is applied as an insulating layer as close as possible to the pads 6. The barrier structure 4 can also act as a shielding against EMI or other influencing interferences such as magnetism, radio frequencies, etc. and additionally may protect the component 5.

It was also found that substantially complete wetting of fillers by the surrounding barrier structure 4, which is for example a molded structure having a resin matrix, can have a significant contribution to a reduction/prevention of copper migration. The material of the barrier structure 4 is selected to minimize the diffusion path therethrough. Such material should exhibit a good adhesion between a resin matrix and fillers because the fewer or smaller the clearances are, the smaller the risk of copper migration is. Compared with FR-4, materials with lower chlorine content, higher glass transition temperature (Tg) and lower percentage of relative humidity (rH) are beneficial. The material should also not contain many voids but should have a low diffusion coefficient and/or a high density, for example a lower diffusion coefficient and/or a higher density than FR-4 which may have a diffusion coefficient of 1 $\mu m^2$ $s^{-1}$ and a density of 1.850 $g/cm^3$. In addition, a layer thickness of the barrier structure 4 is adjusted to reduce or inhibit (copper) migration. The barrier structure 4 can be a barrier film structure or a barrier film microstructure. The barrier film (micro) structure can act as a migration buffer zone.

Furthermore, a diffusion coefficient of the barrier structure 4 should be as small as possible, for example smaller than 15-13 $m^2/s$, preferable smaller than 10-13 $m^2/s$, more preferred smaller than 5-13 $m^2/s$ at a relative humidity of 85% at 85° C., for example in order to achieve a diffusion barrier.

Preferably, the barrier structure 4 comprises a ceramic material. Preferably, the barrier structure 4 is a molded structure, i.e. the barrier structure 4 comprises a molding material. The molding material can be formed of a resin matrix in which the ceramic material is contained. The higher the ceramic content of the barrier structure 4 is, the more effective the migration of electrically conductive material is prevented from occurring. For example, epoxy resins filled with $SiO_2$ with a concentration of fillers up to 90 percent by weight can be used. With these materials, expansion coefficients being smaller than 10 ppm/K and glass transition temperatures being larger than 200° C. can be realized, which are thus well adapted to common substrate materials such as those present in the at least one electrically conductive layer structure 2, the at least one electrically insulating layer structure 3 and components 5.

Depending on the material, the barrier structure 4, which is in the shape of a layer, has also a higher stiffness compared to standard insulating materials such as FR4 or ABF, which means that the barrier structure layers 4 can be very thin and still remain warp-resistant.

Besides to the ceramic material, the barrier structure 4 can comprise a hydrophobic material and/or a diffusion barrier material, for example tantalum (Ta).

The component 5 is embedded face-up within the barrier structure 4, that means the pads 6 of the component 5 are located at an upper main surface of the component 5. A portion of the electrically conductive layer structure 2 and a portion of each pad 6 comprise copper which is in contact with the barrier structure 4. The barrier structure 4 directly contacts, in particularly directly surrounds, a part of the conductive layer structure 2 and of the pads 6. More concrete, the barrier structure 4 directly surrounds the vertical through-connections 7 and directly contacts the patterned electrically conductive layer 8.

The component 5 is first surface mounted on the lower electrically insulating layer structure 3 and then embedded in the barrier structure 4 of the component carrier 1. After the formation of the vertical through-connections 7 and the patterned electrically conductive layer 8 in and on the barrier structure 4, respectively, an upper electrically insulating layer structure 3 is applied on the patterned electrically conductive layer 8. The patterned electrically conductive layer 8 and the upper electrically insulating layer structure 3 form a first portion 9 of the stack. The lower electrically insulating layer structure 3 forms a second portion 10 of the stack. The barrier structure 4 is thus vertically sandwiched between the first portion 9 of the stack and the second portion 10 of the stack.

The embedded component 5 can be a semiconductor chip, in particular a power semiconductor chip. Even when a power semiconductor chip is usually susceptible to electron migration, the same can be prevented by the barrier structure 4.

Alternatively, the component 5 can be an electrically non-conductive and/or electrically conductive inlay, a heat transfer unit, a light guiding element, an energy harvesting unit, an active electronic component, a passive electronic component, a storage device, a filter, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip.

Figure 2:
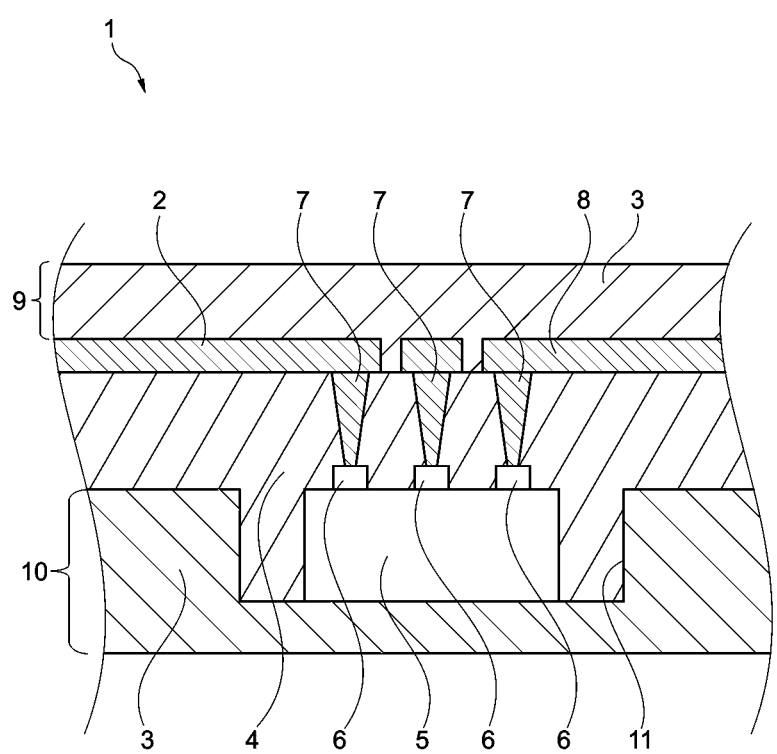
FIG. 2 illustrates a cross-sectional view of a component carrier according to an exemplary embodiment of the invention.

FIG. 2 illustrates a cross-sectional view of a component carrier 1 according to an exemplary embodiment of the invention. The component carrier 1 according to the embodiment of FIG. 2 is similar to the component carrier 1 according to the embodiment of FIG. 1 except for the following main differences.

The component 5 is accommodated in a cavity 11 of the stack, and the barrier structure 4 closes the cavity 11. The cavity 11 is formed within the electrically insulating layer structure 3 of the stack. In the embodiment of FIG. 2, the barrier structure 4 is a molded structure and fills the cavity 11. Alternatively, the cavity 11 can entirely be occupied by the component 5 so that the cavity 11 is not filled by the barrier structure 4 at lateral sides of the component 5. Alternatively, the cavity 11 is not filled by the barrier structure 4 only at one lateral side or only at some lateral sides of the component 5. In these cases, where the cavity 11 is not completely filled by the component 5 alone, the cavity 11 is not filled by the barrier structure 4 at all lateral sides of the component 5.

Apart from its main surface with the at least one pad 6, the component 5 is surrounded by material of the stack at its lateral sides, and the main surface of the component 5 with the at least one pad 6 and also the electrically conductive layer structure 2 connected thereto are connected to the barrier structure 4.

Figure 3:
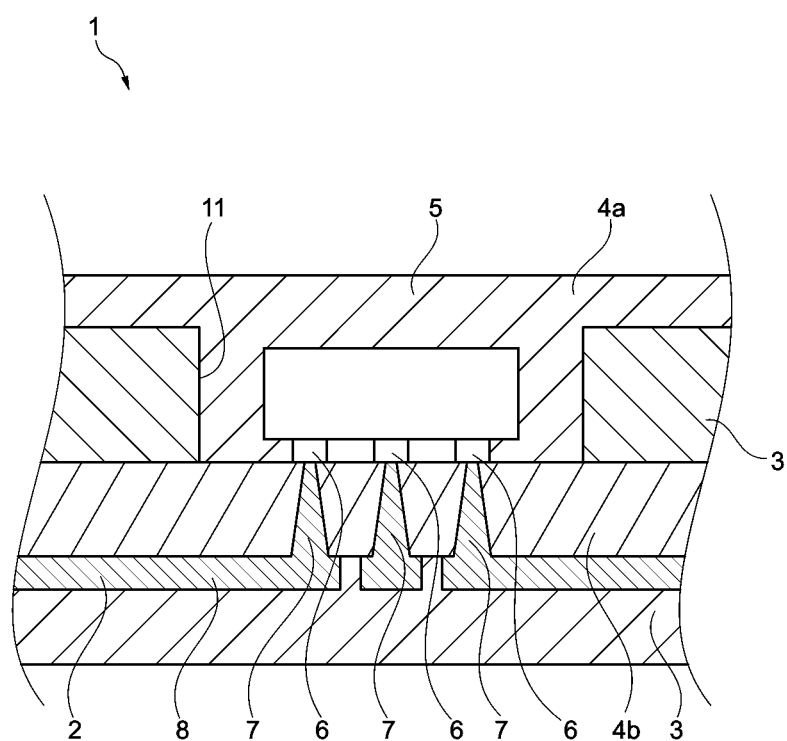
FIG. 3 illustrates a cross-sectional view of a component carrier according to an exemplary embodiment of the invention.

FIG. 3 illustrates a cross-sectional view of a component carrier 1 according to an exemplary embodiment of the invention. The component carrier 1 according to the embodiment of FIG. 3 is similar to the component carrier 1 according to the embodiment of FIG. 1 except for the following main differences.

The component 5 is entirely embedded within the barrier structure 4. Thereby, all sides of the component 5 are connected with the barrier structure 4.

The component 5 is embedded face-down within the barrier structure 4, that means the pads 6 of the component 5 are located at a bottom main surface of the component 5. As a matter of course, the component 5 can alternatively be embedded face-up within the barrier structure 4, that means the pads 6 of the component 5 are located at a top main surface of the component 5.

The barrier structure 4 comprises an upper barrier structure 4a and a lower barrier structure 4b. The upper and lower barrier structures 4a, 4b are molded structures. Alternatively, one of the upper and lower barrier structures 4a, 4b can be replaced by a conventional electrically insulating layer structure 3 without barrier effect and which is either molded or laminated. This would be in the case of a component carrier 1 having one more sensitive side that needs to be protected from copper migration and another side that does not need the protection. Such sensitivity may also depend on the L/S factor (line/space), that means the smaller the L/S factor is, the higher a risk induced by copper migration is. A laminated structure is usually not molded but attached to an adjacent structure of the stack under application of heat and pressure.

A transition between the upper and lower barrier structures 4a, 4b is located at that main side of the component 5 where the pads 6 are arranged.

A portion of the electrically conductive layer structure 2 and a portion of each pad 6 comprise copper which is in contact with the barrier structure 4. The upper barrier structure 4a directly contacts, in particularly directly surrounds, a part of the pads 6, and the lower barrier structure 4b directly contacts, in particular directly surrounds, a part of the vertical through-connections 7 and directly contacts a part of the patterned electrically conductive layer 8.

The component 5 can be first surface mounted on the lower barrier structure 4b and then embedded in the upper barrier structure 4a, or the component 5 can be first embedded in the upper barrier structure 4a and then surface mounted on the lower barrier structure 4b. In the latter case, it is appropriate to use a sacrificial layer (such as sticky tape) at the bottom of a cavity 11 in the electrically insulating layer structure 3, which can be filled or molded by a material of the upper barrier structure 4a, and then to strip-off the sacrificial layer and to add the lower barrier structure 4b.

The component 5 is laterally surrounded by the stack, in particular by the electrically insulating layer structure 3, and mounted on the barrier structure 4, here on the lower barrier structure 4b. The cavity 11 is formed by the electrically insulating layer structure 3 of the stack and the lower barrier structure 4b. The component 5 and its pads 6 are completely surrounded or encapsulated by the barrier structure 4.

In the embodiment of FIG. 3, the upper barrier structure 4a is a molded structure and fills the cavity 11. Alternatively, the cavity 11 can partially or entirely be occupied by the component 5 so that the cavity 11 is not filled by the upper barrier structure 4a at lateral sides of the component 5.

Figure 4:
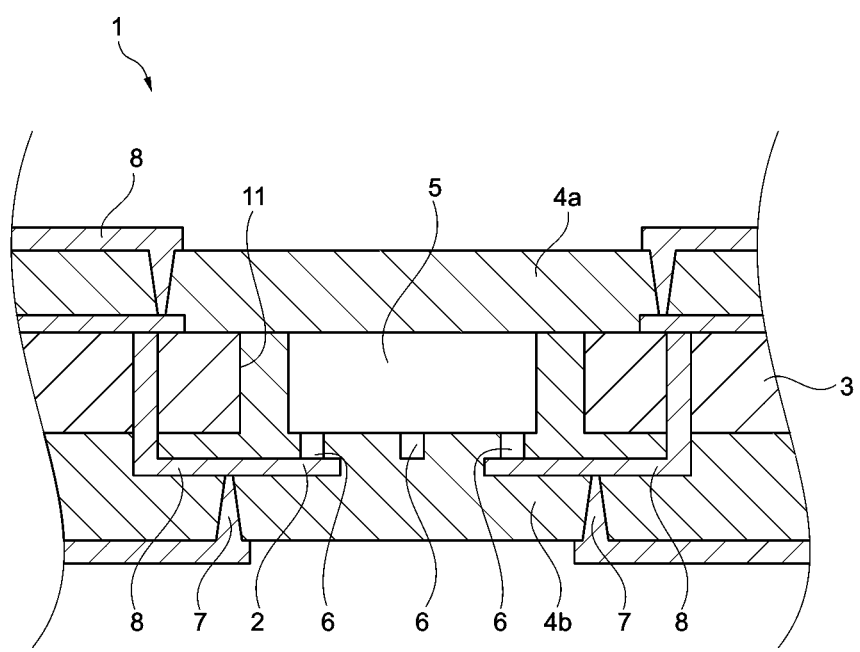
FIG. 4 illustrates a cross-sectional view of a component carrier according to an exemplary embodiment of the invention.

FIG. 4 illustrates a cross-sectional view of a component carrier 1 according to an exemplary embodiment of the invention. The component carrier 1 according to the embodiment of FIG. 4 is similar to the component carrier 1 according to the embodiment of FIG. 3 except for the following main differences.

The pads 6 of the component 5 directly contact the electrically conductive layer structure 2, that means the patterned electrically conductive layer 8 without vertical through-connections 7 therebetween.

The barrier structure 4 comprises an upper barrier structure 4a and a lower barrier structure 4b. In the embodiment of FIG. 4, the lower barrier structure 4b is a molded structure and fills the cavity 11. Alternatively, the cavity 11 can entirely be occupied by the component 5 so that the cavity 11 is not filled by the lower barrier structure 4b at lateral sides of the component 5. Also, the upper barrier structure 4a can be a molded structure.

Alternatively, one of the upper and lower barrier structures 4a, 4b can be replaced by a conventional electrically insulating layer structure 3 without barrier effect and which is either molded or laminated. A laminated structure is usually not molded but attached to an adjacent structure of the stack under application of heat and pressure.

A transition between the upper and lower barrier structures 4a, 4b is located at a main side of the component 5 opposite to that main side where the pads 6 are arranged.

Figure 5:
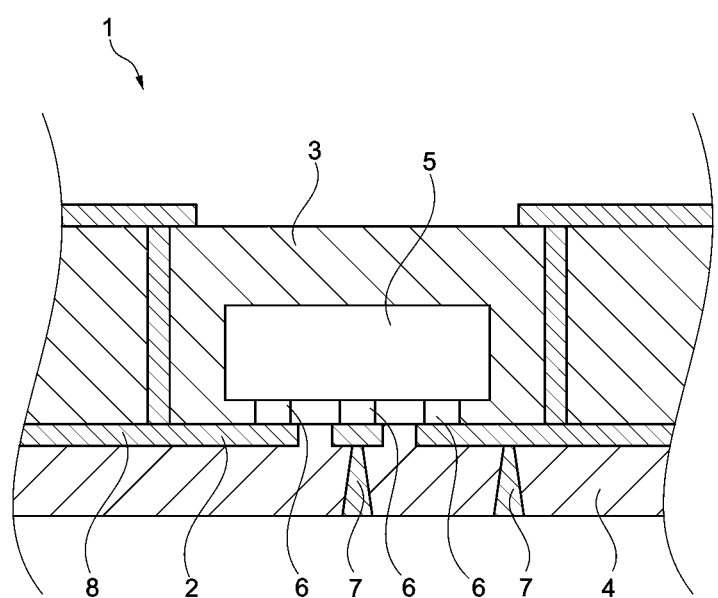
FIG. 5 illustrates a cross-sectional view of a component carrier according to an exemplary embodiment of the invention.

FIG. 5 illustrates a cross-sectional view of a component carrier 1 according to an exemplary embodiment of the invention. The component carrier 1 according to the embodiment of FIG. 5 is similar to the component carrier 1 according to the embodiment of FIG. 4 except for the following main differences.

Some pads 6 of the component 5 directly contact the electrically conductive layer structure 2, that means the patterned electrically conductive layer 8 without vertical through-connections 7 therebetween. Another pad 6 is connected to a vertical through-connection 7, in particular a copper via.

The component carrier 1 does not comprise a cavity 11.

The component 5 is embedded in a conventional electrically insulating layer structure 3 without barrier effect and which is either molded or laminated. The barrier structure 4 is arranged below the component 5.

The barrier structure 4 begins at that side of the component 5 where the pads 6 are arranged and extends downwards.

In a modification, the electrically insulating layer structure 3 can be replaced by a barrier structure 4, in particular by a molded structure.

Figure 6:
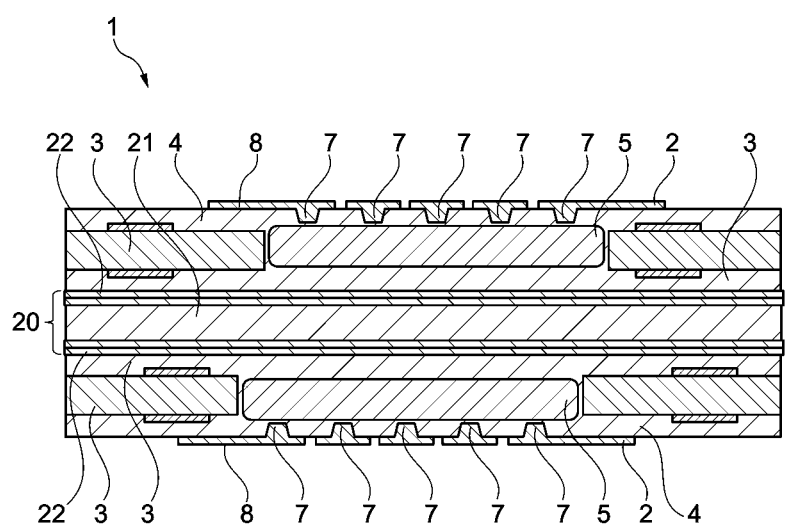
FIG. 6 illustrates a cross-sectional view of an intermediate product during a method of manufacturing a component carrier according to an exemplary embodiment of the invention.

FIG. 6 illustrates a cross-sectional view of an intermediate product during a method of manufacturing a component carrier 1 according to an exemplary embodiment of the invention. The same references signs in FIG. 6 designate the same or similar elements of the embodiments in FIGS. 1 to 5.

In the embodiment of FIG. 6, a temporary carrier 20 is used which comprises a core 21 and electrically conductive layer structures 22 at each main surface of the core 21. A prefabricated temporary carrier 20 can be utilized.

The method of manufacturing a component carrier 1 includes a step of forming the electrically insulating layer structures 3 and the electrically conductive layer structures 2 of the stack of the component carrier 1 symmetrically on both sides of the temporary carrier 20. Thereby, the efficiency and the yield of the manufacturing method is improved. Alternatively, the electrically insulating layer structures 2 and the electrically conductive layer structures 3 of the stack can be formed asymmetrically on only one side of the temporary carrier 20.

The method of manufacturing a component carrier 1 further includes a step of forming a barrier structure 4 connected with the stack, and embedding a component 5 having at least one pad 6 in the stack and/or in the barrier structure 4. Thereby, at least a part of copper material of at least one of the at least one electrically conductive layer structure 2 and/or of the at least one pad 6 is arranged to be in contact with the barrier structure 4. As a result, each stack comprises a barrier structure 4, in particular a molded structure, at that main surface of the component 5 where the pads 6 are arranged. Optionally, the electrically insulating layer structures 3 can either be molded or laminated structures.

After having formed the stacks on the temporary carrier 20, the stacks are released/removed from both sides of the temporary carrier 20. The release process can be facilitated by adding a release layer onto the temporary carrier 20 (sacrificial structure 20). The component carriers 1 having these stacks are so called coreless component carriers 1 which are sufficiently dimensionally stable, stress tolerant and/or exhibit low-warpage in spite of their relatively small thicknesses. Depending on the material, the barrier structure 4, which is in the shape of a layer, has also a higher stiffness compared to standard insulating materials such as FR4 or ABF, which means that the barrier structure layers 4 can be very thin and still remain warp-resistant. This is an excellent advantage in a realization of (thin) layers with the embedded component 5 in such a coreless process.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

The invention claimed is:

1. A component carrier, comprising:
   a stack comprising at least one electrically conductive layer structure and at least one electrically insulating layer structure;
   a barrier structure;
   a component having at least one pad, the component being embedded in the stack and/or in the barrier structure;
   wherein at least a portion of one of the at least one electrically conductive layer structure and the at least one pad comprises copper in contact with the barrier structure,
   wherein the barrier structure is a molded structure comprising a molded material thereby forming a single uniform layer and is configured for reducing the migration of electrically conductive material,
   wherein the barrier structure surrounds at least partially the sidewalls of and one main surface of the component.

2. The component carrier according to claim 1, wherein the embedded component is a semiconductor chip.

3. The component carrier according to claim 1, wherein the barrier structure directly contacts at least a part of one of the electrically conductive layer structure and/or the at least one pad.

4. The component carrier according to claim 1, wherein the component is partially or entirely embedded within the barrier structure.

5. The component carrier according to claim 1, wherein the at least one electrically conductive layer structure comprises at least one of the group consisting of a vertical through-connection a copper via, a patterned electrically conductive layer and a patterned copper foil.

6. The component carrier according to claim 1, wherein the barrier structure is vertically sandwiched between a first portion of the stack and a second portion of the stack.

7. The component carrier according to claim 1, wherein the component is accommodated in a cavity of the stack, the barrier structure closes the cavity, wherein copper migration is inhibited when conducting an electric current by at least one of the at least electrically conductive layer structure and/or by the at least one pad.

8. The component carrier according to claim 1, wherein the component is laterally surrounded by the stack and mounted on the barrier structure.

9. The component carrier according to claim 1, wherein apart from a component main surface with the at least one pad, the component is surrounded by material of the stack, and the main surface of the component with the at least one pad and also the at least one electrically conductive layer structure connected thereto are connected to the barrier structure.

10. The component carrier according to claim 1, comprising at least one of the following features:
    the component carrier comprises at least one component being surface mounted on and/or embedded in the component carrier, wherein the at least one component is selected from a group consisting of an electronic component, an electrically non-conductive and/or electrically conductive inlay, a heat transfer unit, a light guiding element, an optical element, a bridge, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip;
    wherein at least one of the electrically conductive layer structures of the component carrier comprises at least one of the group consisting of copper, aluminum, nickel, silver, gold, palladium, and tungsten;
    wherein the electrically insulating layer structure comprises at least one of the group consisting of reinforced or non-reinforced resin, epoxy resin or bismaleimide-triazine resin, FR-4, FR-5, cyanate ester, polyphenylene derivate, glass, prepreg material, polyimide, polyamide, liquid crystal polymer, epoxy-based build-up film, polytetrafluoroethylene, a ceramic, and a metal oxide;
    wherein the component carrier is shaped as a plate;
    wherein the component carrier is configured as one of the group consisting of a printed circuit board, a substrate, and an interposer;
    wherein the component carrier is configured as a laminate-type component carrier.

11. A method of manufacturing a component carrier, comprising:
    forming a stack comprising at least one electrically conductive layer structure and at least one electrically insulating layer structure;
    forming a barrier structure connected with the stack;
    embedding a component having at least one pad in the stack and/or in the barrier structure; and
    arranging at least a part of copper material of at least one of the at least one electrically conductive layer structure and/or of the at least one pad in contact with the barrier structure,
    wherein forming the barrier structure comprises molding with a molding material that forms a single uniform layer which surrounds at least partially the sidewalls of and one main surface of the component and is configured for reducing the migration of electrically conductive material.

12. A method, comprising:

providing a component carrier including a stack, a barrier structure connected to the stack and a component having at least one pad, the component being embedded in the stack and/or in the barrier structure, the stack having at least one electrically conductive layer structure and at least one electrically insulating layer structure, wherein at least a portion of one of the at least one electrically conductive layer structure and the at least one pad comprises copper in contact with the barrier structure, wherein the barrier structure is a molded structure comprising a molded material forming a single uniform layer surrounding at least partially the sidewalls of and one main surface of the component and is configured for reducing the migration of electrically conductive material; and applying an electrical potential to the component carrier thereby reducing or inhibiting copper migration when conducting an electric current of at least 1 Ampere by at least one of the at least electrically conductive layer structure and/or by the at least one pad.

13. The method according to claim 12, wherein the barrier structure substantially inhibits the copper migration with the current having a current density up to 100 kA/cm.

* * * * *